United States Patent
Monaco et al.

(10) Patent No.: US 9,444,435 B1
(45) Date of Patent: Sep. 13, 2016

(54) INJECTION LOCKED RING OSCILLATOR CIRCUIT WITH AN ANALOG QUADRATURE CALIBRATION LOOP

(71) Applicant: STMicroelectronics S.r.l., Agrate Brianza (IT)

(72) Inventors: Enrico Monaco, Carpi (IT); Gabriele Anzalone, Modena (IT); Simone Erba, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/887,487

(22) Filed: Oct. 20, 2015

(51) Int. Cl.
*H03K 3/03* (2006.01)

(52) U.S. Cl.
CPC .................. *H03K 3/0315* (2013.01)

(58) Field of Classification Search
CPC ...................................................... H03L 7/0996
USPC ...................................................... 331/57, 45
See application file for complete search history.

(56) References Cited

U.S. PATENT DOCUMENTS

| | | | | |
|---|---|---|---|---|
| 2006/0244546 | A1* | 11/2006 | Yamamoto ............... | H03B 5/04 331/158 |
| 2009/0243679 | A1* | 10/2009 | Smith ....................... | H03L 7/07 327/158 |

OTHER PUBLICATIONS

Bonfanti, et al: "A 15-GHz broad-band/2 frequency divider in 0.12um CMOS for quadrature generation," IEEE Microwave and Wireless Components Letters, vol. 15, No. 11 (2005), pp. 724-726.
Carnincks et al: "A harmonic quadrature LO generator using a 90 degree delay-locked loop," IEEE 2004, pp. 127-130.
Grozing et al: "CMOS ring oscillator with quadrature outputs and 100MHz to 3.5 GHz tuning range," IEEE 2003, pp. 679-682.
Kaukovuori et al: "Analysis and design of passive polyphase filters," IEEE Trans on Circuits and Systems, vol. 55, No. 10 (2008), pp. 3023-3037.
Mazzanti et al: "A low phase-noise multi-phase LO generator for wideband demodulators based on reconfigurable sub-harmonic mixers," IEEE JSSC vol. 45. No. 10, Oct. 2010, pp. 2104-2115.
Mazzanti et al: "Analysis and design of a double-quadrature CMOS VCO for subharmonic mixing at Ka-band," IEEE Trans on Microwave Theory and Techniques, vol. 56, No. 2 (2008), pp. 355-363.

\* cited by examiner

*Primary Examiner* — Joseph Chang
(74) *Attorney, Agent, or Firm* — Gardere Wynne Sewell LLP

(57) ABSTRACT

A ring oscillator includes a first delay stage generating a first phase signal and a second delay stage generating a second phase signal. Each of the first and second delay stages includes variable resistance circuit. A phase comparator circuit performs a phase comparison between the first and second phase signals to generate a phase error signal. An amplifier circuit generates a control signal from the phase error signal. A feedback loop applies the control signal to control the resistance of the variable resistance circuits in the first and second delay stages.

19 Claims, 4 Drawing Sheets

INJECTION LOCKED RING OSCILLATOR CIRCUIT WITH AN ANALOG QUADRATURE CALIBRATION LOOP

TECHNICAL FIELD

The present disclosure generally relates to oscillator circuits and, more particularly, to ring oscillator circuits.

BACKGROUND

Multiphase clocks are useful in many applications. In high-speed serial link applications, multi-phase clocks are used to process data streams at a bit rate higher than the internal clock frequencies. In clock multiplier applications, multiphase clocks are combined to produce the desired output frequency for the synthesizer. In microprocessors, multiphase clocks can ease the clock constraints in the pre-charge logic to achieve higher operating speeds. In wireless designs, radio frequency multi-phase clocks are required for direct conversion, while in baseband circuitry the multiphase clocks can be used to find a better sampling point for the analog-to-digital converter (ADC) to improve overall system performance.

Several techniques are known in the art for implementing multi-phase clock generation. Some of those techniques are listed below:

1. Multiphase voltage-controlled oscillator (M-VCO) (see, for example, Mazzanti, et al, "Analysis and Design of a Double-Quadrature CMOS VCO for Subharmonic Mixing at Ka-Band," IEEE Transactions on Microwave Theory and Techniques, vol. 56, iss. 2, pp. 355-363, 2008 (incorporated by reference));

2. Delay Locked Loop (DLL) (see, for example, Craninckx, et al., "A harmonic quadrature LO generator using a 90° delay-locked loop," in Proc. European Solid-State Circuits Conf. (ESSCIRC), 2004, pp. 127-130 (incorporated by reference));

3. Quadrature through a Frequency Division (see, for example, Bonfanti, et al., "A 15-GHz broad-band/2 frequency divider in 0.13 μm CMOS for quadrature generation," IEEE Microw. Wireless Compon. Lett., vol. 15, no. 11, pp. 724-726, November 2005 (incorporated by reference));

4. Quadrature through Poly Phase Filter (see, for example, Kaukovuori, et al., "Analysis and design of passive polyphase filters," IEEE Trans. Circuits Syst. I, Reg. Papers, vol. 55, no. 10, pp. 3023-3037, November 2008 (incorporated by reference); and 5. Injection Locked Ring Oscillator (see, for example, Grozing, et al., "CMOS Ring Oscillator with Quadrature Outputs and 100 MHz to 3.5 GHz Tuning Range," Proc. 29th European Solid-State Circuits Conf. (ESSCIRC 03), IEEE Press, 2003, pp. 679-682 (incorporated by reference)).

Each of these techniques presents one or more disadvantages for a wide-band application.

The M-VCO technique uses four stages connected as shown in the example of FIG. 1. The signal produced from the in-phase side of the oscillator is injected in the quadrature-phase side of the oscillator, and vice versa. The inversion present in the ring feedback allows for the generation of two signals in quadrature. There are two known implementations through use of an LC-tank circuit or a delay cell.

The LC-tank VCO implementation ensures an adequate spectral purity of the generated clock. This circuit can be tuned to work over a range of frequencies acting on the value of the inductor or the capacitor composing the tank. For high frequency applications, variable capacitors, used as tuning elements in VCOs, present poor quality factors for a given tuning range, and dividers used in the phase-locked loop feedback path are power hungry. LC-tank VCOs have been successfully used in narrowband systems. A trade-off between tuning range and phase noise is present. Moreover, multiphase oscillators show a high phase noise, in particular a flicker component that is up-converted into phase noise.

The delay cell VCO solution employs cells with a variable delay. To achieve oscillation, the ring must provide a phase shift of $2\pi$ and have unity voltage gain at the oscillation frequency. Each delay stage must provide a phase shift of $\pi/N$, where N is the number of delay stages. This approach is commonly affected by problems related to process variations and mismatches. An additional weakness of this circuit is represented by the jitter accumulated along the loop related to the phase uncertainty, corresponding to a high phase noise compared to what is achieved by LC-tank implementations.

The DLL solution, as in the ring oscillator, exploits the use of delays cells as depicted in FIG. 2. Unlike the ring oscillator, in this case a digital loop is commonly used. A signal at the desired frequency is provided at the input of the chain. A phase detector is used to compare the output and the input phase difference. This information is used to calibrate the delay in each cell to provide equally spaced phase versions of the same input clock. The drawbacks of this solution include: sensitivity process variations and mismatch; accumulation of jitter along the loop and complex calibration logic.

Another solution generates the quadrature signals through the use of a frequency divider. The generation of two clocks in quadrature can be done by the double sampler configuration as shown in FIG. 3. This solution is wide-band by construction. To properly work, this architecture requires at its input a clock at the twice the desired frequency. This signal can be provided by an oscillator that works in a range of frequencies that is the double of the desired frequency. This double-speed requirement heavily impacts the VCO design. Indeed, the divider circuit quickly becomes power hungry as the frequency increases. Another drawback of this solution is that it can only produce two output phases.

The poly phase filter (PPF) solution is shown in FIG. 4. The simplest way of generating the I-Q signals is with an RC-CR network: the signal at the in-phase I-output has a 45-degree phase lag, and the signal at the quadrature-phase Q-output has a 45-degree phase lead. Both signals are attenuated by 3 dB. So, at the pole frequency both phase and amplitude are in balance. This structure offers a constant 90-degree phase shift only at the RC frequency and it suffers from amplitude imbalance. Yet another problem is component mismatch: which results in the two RC products being unequal, and this generates a phase error. Hence, better matching is achieved with a larger die area. Another drawback of this solution is that it can only produce two output phases.

The injection locked ring oscillator technique has a block diagram as shown in FIG. 5. This circuit utilizes a loop made of four delay cells, one of which is injected by an input frequency signal. The output signals show the frequency and the phase noise of the input signal. The main drawback of this approach is that it is commonly affected by problems related to temperature and supply variations.

There is a need for an improved ring oscillator circuit that will generate multiple equally-spaced clock phases starting from a unique clock phase signal at the same frequency with high phase accuracy.

SUMMARY

Embodiments disclosed herein provide a wide-band multi-phase clock generation circuit capable of operation at multiple operating frequencies while keeping good performance at different operation frequency and during the variations of process, temperature and supply.

In an embodiment, a circuit comprises: a ring oscillator circuit including a plurality of delay stages coupled in cascade with an inverting feedback; wherein each delay stage includes a variable resistance circuit; a phase comparator circuit configured to perform a phase comparison between two different phases output by two corresponding delay stages of the ring oscillator circuit; and an amplifier circuit configured to generate a control signal in response to said phase comparison, wherein said control signal is fed back to control resistance of the variable resistance circuits in the delay stages of the ring oscillator circuit.

In an embodiment, a method comprises: generating a first phase of an oscillating signal using a first delay stage of a ring oscillator; generating a second phase of the oscillating signal using a second delay stage of a ring oscillator, the second stage coupled to the first stage; phase comparing the first and second phases to generate a phase error signal; converting the phase error signal into a control signal; and controlling load resistance in each of the first and second delay stages using said control signal.

In an embodiment, a circuit comprises: a ring oscillator including a first delay stage generating a first phase signal and a second delay stage generating a second phase signal; wherein each of the first and second delay stages includes variable resistance circuit; a phase comparator circuit configured to phase compare the first and second phase signals to generate a phase error signal; an amplifier circuit configured to generate a control signal from the phase error signal; and a feedback loop configured to apply the control signal to control resistance of the variable resistance circuits in the first and second delay stages.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
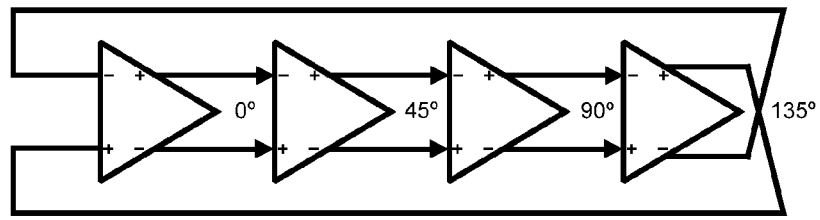
FIG. 1 shows a block diagram of a quadrature voltage-controlled oscillator.
Figure 2:
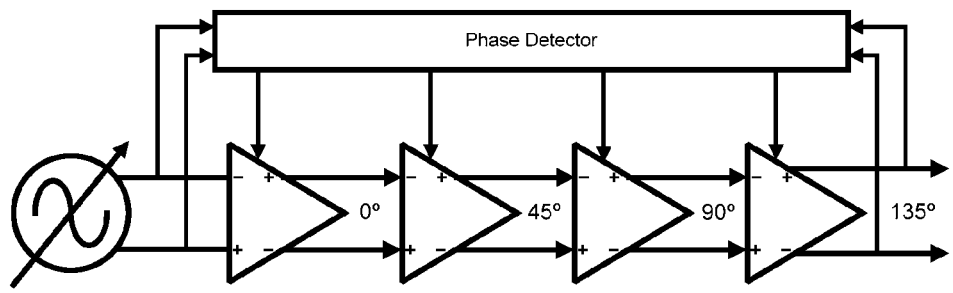
FIG. 2 shows a block diagram of a delay locked loop oscillator.
Figure 3:
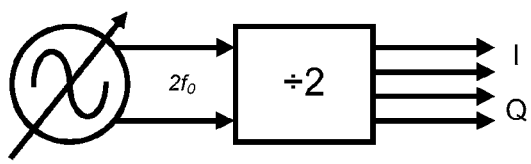
FIG. 3 shows a block diagram of a frequency divider oscillator.
Figure 4:
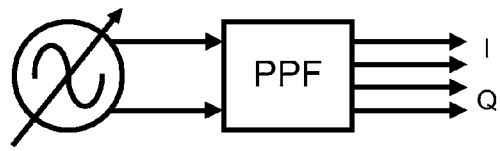
FIG. 4 shows a block diagram of a poly phase filter oscillator.
Figure 5:
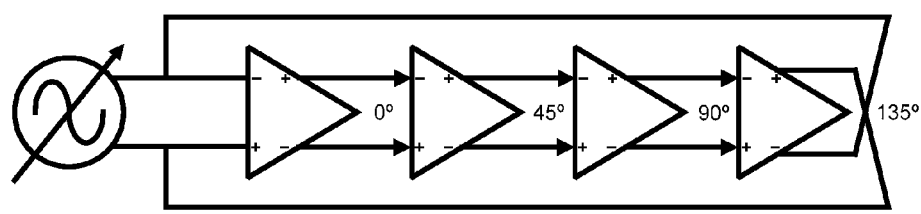
FIG. 5 shows a block diagram of an injection locked ring oscillator.

The same elements have been designated with the same reference numerals in the different drawings. In particular, the structural and/or functional elements common to the different embodiments may be designated with the same reference numerals and may have identical structural, dimensional, and material properties. For clarity, only those steps and elements which are useful to the understanding of the described embodiments have been shown and will be detailed. In particular, the circuits powered by the power converter have not been detailed, the described embodiments being compatible with usual applications. In the following description, when reference is made to terms "about", "approximately", or "in the order of", this means to within 10%, preferably to within 5%.

Figure 6:
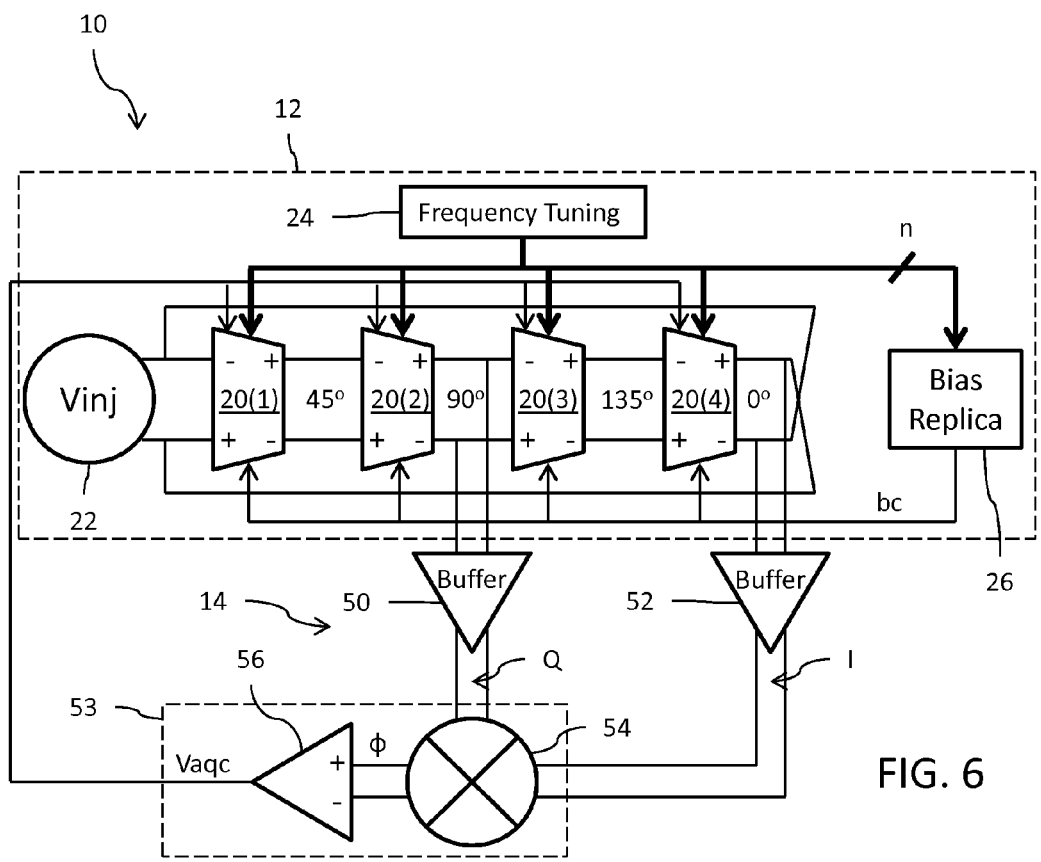
FIG. 6 shows a block diagram of an injection locked ring oscillator with an analog quadrature calibration circuit.

Reference is now made FIG. 6 showing a block diagram of a quadrature calibrated injection locked ring oscillator circuit 10. The oscillator circuit 10 includes an injection locked ring oscillator 12 and an analog quadrature calibration loop 14.

The injection locked ring oscillator 12 includes four delay cell stages 20(1)-20(4) coupled in cascade with the output of the last stage 20(4) fed back with an 180° phase shift to the input of the first stage 20(1). The first stage 20(1) further receives an injection oscillation locking frequency signal (Vinj) generated by an oscillator circuit 22. In a preferred embodiment, the delay cell stages 20 are differential circuits having differential signal inputs and differential signal outputs. The respective inverting and non-inverting terminals for the differential signals are indicated by "−" and "+" designators, respectively. The effect of the delay introduced by each delay cell stage 20 is to introduce a phase shift in the oscillation signal from stage to stage. For example, the differential signal outputs from stage 20(1) may be considered to have the 45° phase shift, the differential signal outputs from stage 20(2) may be considered to have the 90° phase shift, the differential signal outputs from stage 20(3) may be considered to have the 135° phase shift, and the differential signal outputs from stage 20(4) may be considered to have the 0° phase shift. Thus, the differential signal outputs from stages 20(1) and 20(3) have a quadrature phase relationship (i.e., offset by 90°), and the differential signal outputs from stages 20(2) and 20(4) have a quadrature phase relationship.

The free-run frequency f0 of the injection locked ring oscillator 12 is digitally tunable using a frequency tuning circuit 24 that outputs an n-bit control signal that is applied to each of the delay cell stages 20. This digital tuning control is important to ensure that the free-run frequency of the injection locked ring oscillator 12 matches the frequency finj of the injection oscillation locking signal generated by the oscillator circuit 22. It is only when this matching in frequency occurs that the phases of the signals at the differential signal outputs from consecutive delay cell stages 20 will be offset by 45°. Thus, the relative phase error between consecutive delay cell stages 20 is proportional to frequency offset between the free-run frequency and the injection oscillation locking signal frequency.

Using the digital calibration functionality through the frequency tuning circuit 24, compensation for process variation can be achieved. However, the digital calibration is not executed during normal operation of the oscillator 10. For this reason, variations in temperature and supply voltage (following calibration) are not compensated, and this can result in errors in the output phases. The analog quadrature calibration loop 14 provides for temperature and supply voltage compensation.

Bias for the delay cell stages 20 is provided by a bias replica circuit 26. The bias replica circuit 26 also receives the n-bit control signal frequency tuning circuit 24, and thus the bias control signal bc generated by the bias replica circuit 26 is dependent on the calibration of the free-run frequency.

Figure 7:
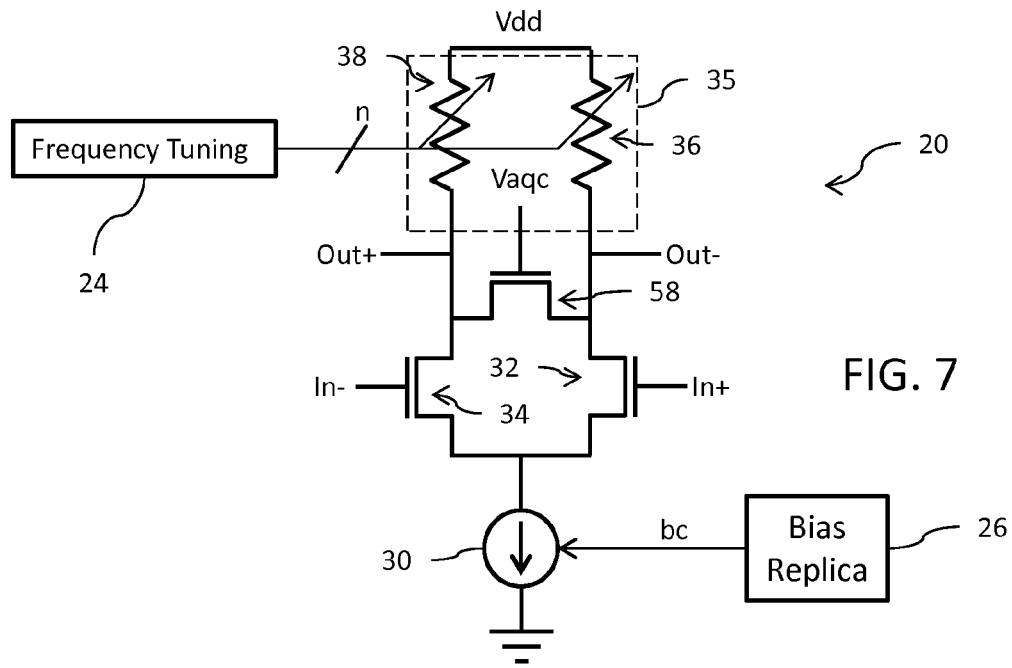
FIG. 7 is a circuit diagram of a delay cell stage.

Reference is now made to FIG. 7 showing a circuit diagram of the delay cell stage 20. Each stage 20 comprises a tail current source 30 that biases a differential input transistor pair 32 and 34. The bias provided by the tail current source 30 is controlled by the bias replica circuit 26 in response to the bias control signal (bc). The tail current source 30 is coupled to a ground supply node. The gate terminals for the transistors in the differential input transistor pair 32 and 34 provide the inverting and non-inverting input terminals (In− and In+) for the delay cell stage 20. The non-inverting and inverting differential output terminals (Out+ and Out−) for the delay cell stage 20 are provided at the drain terminals of the transistors in the differential input transistor pair 32 and 34. The load circuit 35 for the differential input transistor pair 32 and 34 comprises a digitally controlled variable resistance including a first variable resistance circuit 36 coupled in series with the transistor 32 and a second variable resistance circuit 38 coupled in series with the transistor 34. The variable resistance circuits 36 and 38 are coupled to a supply node Vdd. The n-bit control signal output by the frequency tuning circuit 24 controls the resistance of each of the variable resistance circuits 36 and 38. As discussed above, this digital control affects the free-run frequency of the injection locked ring oscillator 12. In an embodiment, each variable resistance circuit may comprise n parallel connected MOS transistors with the gate terminals of the transistors coupled to receive one bit of the n-bit control signal.

Figure 8:
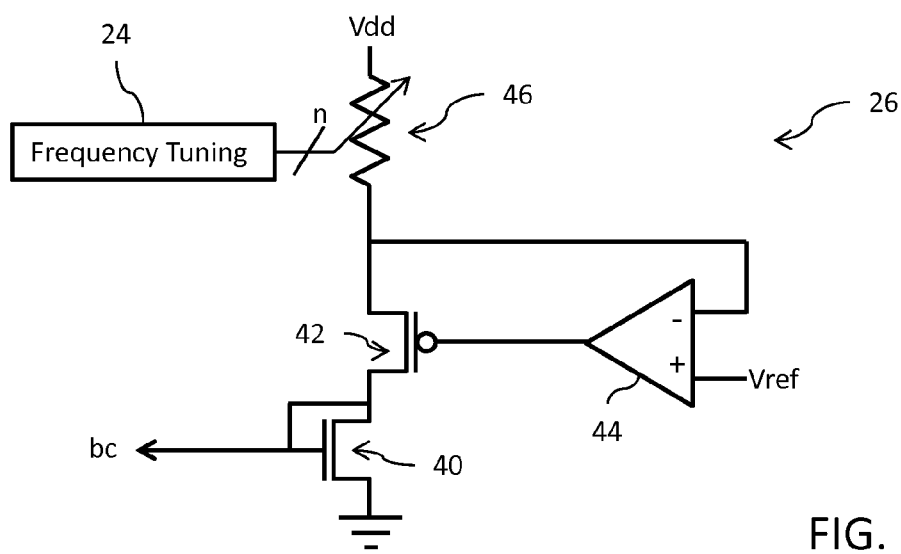
FIG. 8 is a circuit diagram for a bias replica circuit.

Reference is now made to FIG. 8 showing a circuit diagram for the bias replica circuit 26. The bias control signal bc is generated by a transistor 40 implemented as a diode-connected device with the bias control signal bc provided at the gate terminal of transistor 40. In an implementation, the tail current source 30 in each stage 20 is formed by a transistor having a gate terminal connected to transistor 40 in a current mirror relationship. The source terminal of transistor 40 is coupled to the ground reference node. The drain terminal of transistor 40 is coupled to the gate terminal of transistor 40, and is also connected to the drain terminal of a transistor 42. The transistors 40 and 42 are of opposite conductivity type (n-channel and p-channel MOSFETs, respectively, in the illustrated example). The gate terminal of transistor 42 is connected to the output terminal of an operational amplifier 44. An inverting input of the amplifier 44 is coupled to the source terminal of the transistor 42. A non-inverting input of the amplifier 44 is coupled to receive a reference voltage Vref. The amplifier 44 and transistor 42 function as a regulator circuit of the low drop-out type that forces the voltage at the source terminal of the transistor 42 to equal the reference voltage Vref. A variable resistance circuit 46 is coupled in series with the transistor 42. The variable resistance circuit 46 is coupled to the supply node Vdd. The n-bit control signal output by the frequency tuning circuit 24 controls the resistance of the variable resistance circuit 46. The current flowing through transistors 40 and 42 is set as a function of the n-bit signal and the reference voltage Vref. This current drives the bias control signal provided at the gate terminal of transistor 40. In an embodiment, the variable resistance circuit 46 may comprise n parallel connected MOS transistors with the gate terminals of the transistors coupled to receive one bit of the n-bit control signal (where the transistors match the transistors of the circuits 36 and 38).

Reference is now once again made to FIG. 6. The analog quadrature calibration loop 14 includes a first buffer circuit 50 coupled to the differential outputs of one of the delay cell stages 20 (in the illustrated example, delay cell stage 20(2)) to generate a quadrature-phase signal (Q). The analog quadrature calibration loop 14 includes a second buffer circuit 52 coupled to the differential outputs of another one of the delay cell stages 20 (in the illustrated example, delay cell stage 20(4)) to generate an in-phase signal (I). The buffer circuits 50 and 52 function to decouple the core of the injection locked ring oscillator 12 from the analog quadrature calibration loop 14. It will be noted that the differential signals (Q and I) output from the buffer circuits 50 and 52 have a quadrature phase relationship to each other because the differential signals at the outputs of the delay cell stages 20(2) and 20(4) also have a quadrature phase relationship to each other (90° and 0°, respectively). The selection of quadrature-related phases is by way of example only, it being understood that any two phases having a desired relationship with respect to each other could instead be chosen.

The analog quadrature calibration loop 14 further includes phase detector 53 including a mixer circuit 54 that receives the quadrature phase relationship signals (Q and I) output from the buffer circuits 50 and 52. Again, phases that are not quadrature related could instead be chosen with an appropriately configured phase detector 53. The mixer circuit 54 mixes the quadrature phase relationship signals together and generates a differential output signal Φ. Because the quadrature phase relationship signals are at the same frequency, the differential output signal Φ is a DC signal whose differential magnitude is a function of the quadrature phase difference between quadrature phase relationship signals. Thus, any quadrature phase error between the quadrature phase relationship signals output by the buffer circuits 50 and 52 is reflected in the differential output signal Φ. A transimpedance amplifier 56 converts the differential output signal Φ to an analog quadrature calibration control voltage (Vaqc) that is fed back to each of the delay cell stages 20 in a feedback loop. The analog quadrature calibration control voltage functions to adjust the load circuit 35 during operation of the injection locked ring oscillator 12 by varying the load resistance.

Referring again to FIG. 7, the load circuit of each delay cell stage 20 includes a transistor 58 whose source-drain circuit path is coupled between the drain terminals of the differential input transistor pair 32 and 34. The gate terminal of transistor 58 is coupled to receive the analog quadrature calibration control voltage output by the transimpedance amplifier 56. The gate voltage modulates the conductivity of the transistor 58 effectively implementing a variable resistance coupled between the drain terminals of the differential input transistor pair 32 and 34. This variable resistance, unlike the circuits 36 and 38, is varied in real-time during circuit 10 operation, with the variable resistance of transistor 58 affecting the resistance of the load circuit 35 and thus changing the frequency so as to drive the phase difference between the I and Q signals to equal 90°.

Figure 9:
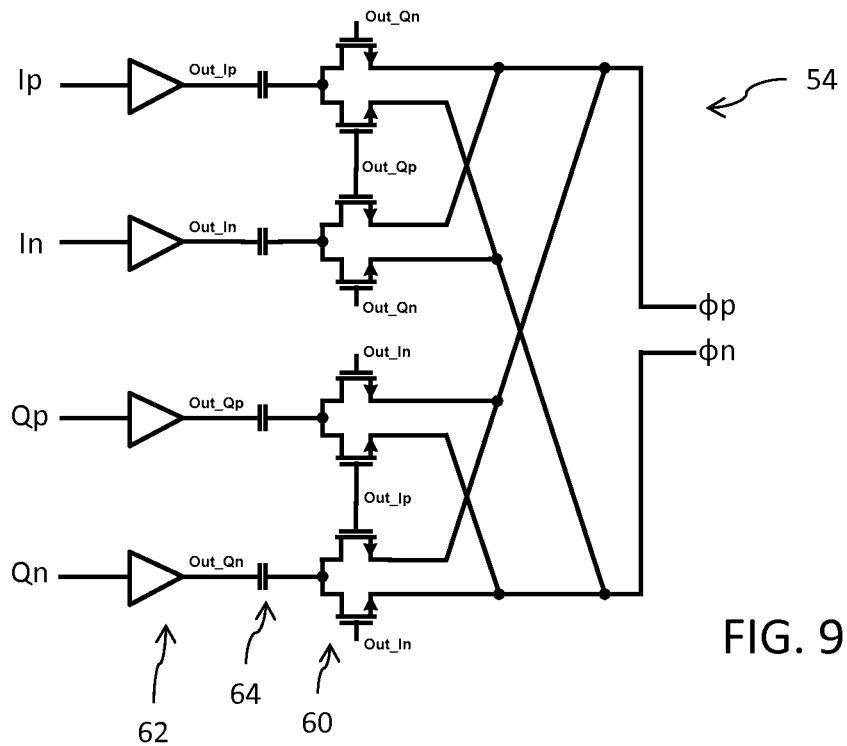
FIG. 9 is a circuit diagram of a mixer circuit.

Reference is now made to FIG. 9 showing a circuit diagram of the mixer circuit 54. The mixer circuit 54 is a passive mixer circuit that receives the differential components Qp and Qn of the quadrature-phase signal Q and the differential components Ip and In of the in-phase signal I. Because the passive mixer circuit is formed by a plurality of transistor switches 60, it is preferable to drive the gate terminals of those switches with CMOS signals. The mixer circuit 54 accordingly uses buffer circuits 62 to convert the common mode logic (CML) differential components (Qp, Qn, Ip, In) of the signals Q and I to CMOS logic signals (Out_Qp, Out_Qn, Out_Ip, Out_In) for application to the gate terminals of transistors 62 as shown. Decoupling capacitors 64 are provided between the outputs of the buffers 62 and the drain terminals of the transistors 60. The mixer circuit 54 outputs differential components Φp and Φn indicative of the phase error.

Figure 10:
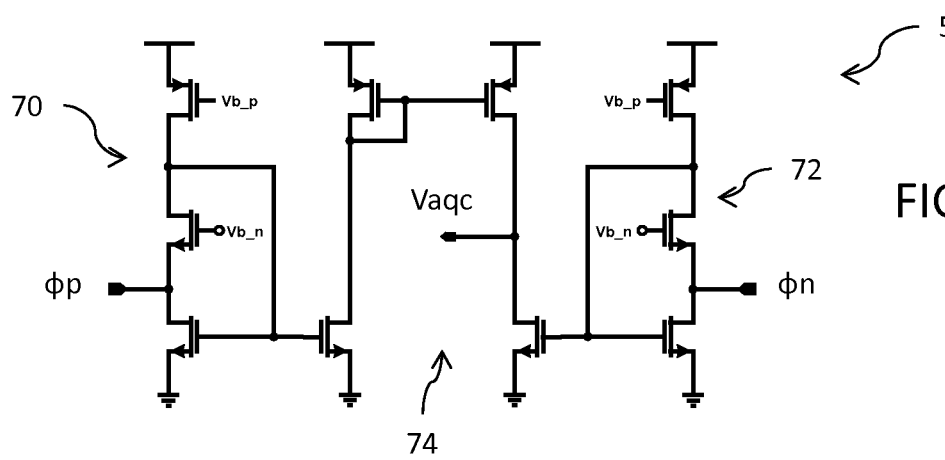
FIG. 10 is a circuit diagram of a transimpedance amplifier.

Reference is now made to FIG. 10 showing a circuit diagram of the transimpedance amplifier 56. The amplifier 56 receives the differential components Φp and Φn and generates the analog quadrature calibration control voltage Vaqc. Bias voltages Vb_p and Vb_n are provided to bias the gate terminals of the p-channel and n-channel transistors in the input stages 70 and 72 of the amplifier 56. Currents generated by the input stages 70 and 72 are subtracted from each other in the output stage 74 to produce the signal Vaqc.

Operation of the circuit of FIG. 6 may be summarized as follows:

The injection locked ring oscillator 12 operates at the natural frequency f0 that is set by the load circuits 35 of the delay cell stages 20. When an external signal with a frequency finj that is close to f0 is injected by the oscillator circuit 22, the output frequency of the injection locked ring oscillator 12 becomes equal to finj. To accommodate the new operating frequency, the output signals of the oscillator show a phase shift, which can be seen as a phase error Φe. Without injection, the oscillator and the load at each stage provide a π/m phase shift to satisfy the phase condition, where m is the number of stages 20.

The following equation shows that the relative phase error Φe between the oscillating output signal for consecutive stages 20 is proportional to the offset between the locking signal frequency and the free-run frequency:

$$\Phi e = -\frac{1}{2}\frac{finj - f0}{f0} = -\frac{\Delta f}{2f0}.$$

The digital calibration using the n-bit control signal output by the frequency tuning circuit 24 compensates for the process variation by adjusting the frequency f0 to equal the frequency finj, but it cannot re-run during the normal operation (i.e., in real-time) to account for changes in temperature or supply which can degenerate the output phases. The analog quadrature calibration loop 14 provides a real-time calibration to compensate for the environment variations. The analog quadrature calibration loop 14 ensures that at any moment the ring oscillator free-run frequency f0 is close to the injection locking frequency finj. In this way the phase error is minimized according to the formula noted above.

The analog quadrature calibration loop 14 is based on a phase detector 53 using the mixer circuit 54 that measures the phase shift between two quadrature outputs of the stages 20. In this regard, although a quadrature phase comparison is illustrated in FIG. 6, it will be understood by those skilled in the art that any pair of the outputs of the ring oscillator 12 can be used by the analog quadrature calibration loop 14. It is only necessary to design the phase detector 53 for the selected phase relationship.

The analog quadrature calibration loop 14 adjusts the free-run frequency of the oscillator 12 using the signal Vaqc to ensure that a desired phase shift exists between the selected pair of output. In the example of FIG. 6, this desired phase shift is 90°. Control over the desired phase shift is accomplished by controlling the voltage applied to the control terminal of transistor 58 in each stage 20. In the illustrated implementation, the transistor 58 is a p-channel MOS transistor as shown in FIG. 7, which allows for making a fine adjustment of the resistive load circuit 35 in each stage 20, with this resistive load adjustment effectuating an adjustment in the free-run frequency of the oscillator 12 in a feedback loop which drives the free-run frequency to equal the injected signal frequency in real-time operation. When this condition is accomplished, all phases of the oscillating signal output by the stages 20 are equally spaced in phase and the variations on temperature and voltage supply are tracked.

The phase detector should show a low noise in order to not affect the overall noise, especially the flicker noise component. The mixer 54 of the phase detector converts the RF signal to a voltage or current DC signal that is proportional to the phase shift error. A low noise mixer is preferably used so as to not degrade the noise performance of the phase generator.

The following advantages and features are noted with respect to the circuit 10: a) generation of accurate multiphase clocks over a wide band, compensating for PVT variations; b) the analog quadrature calibration loop continuously calibrates the ring oscillation free-run frequency to compensate for the temperature and supply variations; c) each stage includes a circuit component acted on by the loop to continuously adjust operation of the stage and thus the ring oscillator free-run frequency; d) use of a low noise mixer in the loop to measure the output phase shift of the stages; e) the loop improves the accuracy of the digital calibration of the stages so as to overcome limitations due to the quantization of the frequency which set the minimum frequency step adjustment equal to the LSB value of the n-bit control signal; f) a buffer circuit is used to decouple the phase detector from the oscillator in order to reduce the capacitive load; g) the loop calibrates the phase shift of the oscillator and its circuits so that the loop produces precise signal phases at the oscillator outputs; h) the isolation of the AQC loop from the oscillator ensures that operation of the loop not affect the output amplitude of the oscillation signals; and i) the isolation of the loop does not affect the output common mode which is set by using a replica bias circuit.

Although not explicitly shown in FIG. 6 in order to simplify the drawing and ensure that the features of the loop 14 are not obscured, in a preferred implementation the circuit 10 further includes buffers, a mixer and transimpedance amplifier (like those at references 50, 52, 56 and 56) for the non-selected phases (i.e., at the outputs of stages 20(1) and 20(3)). These circuits are, in effect, dummy circuits whose presence connected to the circuit 12 ensures a balancing of the ring load at the output of all stages 20.

Various embodiments have been described. Various alterations, modifications, and improvements will readily occur to those skilled in the art. Further, the practical implementation of the embodiments which have been described is within the abilities of those skilled in the art based on the functional indications given hereabove.

The invention claimed is:

1. A circuit, comprising:
    a ring oscillator circuit including a plurality of delay stages coupled in cascade with an inverting feedback;
    wherein each delay stage includes first and second nodes configured to generate a differential output signal and a variable resistance circuit comprising a transistor having a source-drain path directly coupled between the first and second nodes;

a phase comparator circuit configured to perform a phase comparison between two different phases output by two corresponding delay stages of the ring oscillator circuit; and an amplifier circuit configured to generate a control signal in response to said phase comparison, wherein said control signal is fed back to a control terminal of said transistor to control resistance of the source-drain paths in the delay stages of the ring oscillator circuit.

2. The circuit of claim 1, wherein the two different phases are quadrature-related phases and said phase comparator comprises a quadrature phase comparator.

3. The circuit of claim 2, wherein the quadrature phase comparator comprises a quadrature mixer circuit.

4. The circuit of claim 3, wherein the quadrature mixer circuit is a passive mixer circuit.

5. The circuit of claim 1, wherein said amplifier circuit is a transimpedance amplifier.

6. The circuit of claim 1, wherein each delay stage further comprises a load circuit including a first resistor coupled between the first node and a supply voltage node and a second resistor coupled between the second node and the supply voltage node.

7. The circuit of claim 6, wherein the first resistor and the second resistor are variable resistors having digitally controlled resistances.

8. The circuit of claim 7, further comprising a digital tuning circuit configured to output a digital control signal to set the digitally controlled resistances of first resistor and the second resistor.

9. The circuit of claim 1, wherein the control signal is an analog control signal and the source-drain path has an analog controlled resistance between the first and nodes.

10. The circuit of claim 6, wherein the delay stage further comprises a pair of differential input transistors, the first resistor coupled in series with a first one of the pair of differential input transistors at the first node, and the second resistor coupled in series with a second one of the pair of differential input transistors at the second node.

11. The circuit of claim 1, further comprising an oscillating circuit generating an injection frequency signal applied to an input of the ring oscillator circuit.

12. A circuit, comprising:
a ring oscillator including a first delay stage generating a first phase signal and a second delay stage generating a second phase signal;
wherein each of the first and second delay stages includes first and second nodes configured to generate a differential output signal and a variable resistance circuit comprising a transistor having a source terminal directly connected to the first node and a drain terminal directly connected to the second node;
a phase comparator circuit configured to phase compare the first and second phase signals to generate a phase error signal;
an amplifier circuit configured to generate a control signal from the phase error signal; and
a feedback loop configured to apply the control signal to a control terminal of said transistor to control resistance between the first and second nodes in the first and second delay stages.

13. The circuit of claim 12, wherein the first and second phases are quadrature-related phases.

14. The circuit of claim 13, wherein the phase comparator circuit is a quadrature mixer circuit.

15. The circuit of claim 12, wherein each of the first and second delay stages comprises a load circuit including a first resistor coupled between the first node and a reference supply node and a second resistor coupled between the second node and the reference supply node.

16. The circuit of claim 15, wherein the first resistor and the second resistor are variable resistors having digitally controlled resistances.

17. The circuit of claim 16, further comprising a digital tuning circuit configured to output a digital control signal to set the digitally controlled resistances of first resistor and the second resistor.

18. The circuit of claim 12, wherein the control signal is an analog control signal and a conduction path between the first and second nodes provided by said transistor has an analog controlled resistance.

19. The circuit of claim 15, wherein the delay stage further comprises a pair of differential input transistors, the first resistor coupled in series with a first one of the pair of differential input transistors at the first node, and the second resistor coupled in series with a second one of the pair of differential input transistors at the second node.

* * * * *